US005936492A

United States Patent [19]
Shingyoji et al.

[11] Patent Number: 5,936,492
[45] Date of Patent: Aug. 10, 1999

[54] RIBBON, BONDING WIRE AND MICROWAVE CIRCUIT PACKAGE

[75] Inventors: Masahito Shingyoji; Nobuyoshi Takeuchi, both of Wako, Japan

[73] Assignee: Honda Giken Kogyo Kabushiki Kaisha, Tokyo, Japan

[21] Appl. No.: 08/844,921

[22] Filed: Apr. 22, 1997

[30] Foreign Application Priority Data

Apr. 24, 1996 [JP] Japan ................................. 8-102814

[51] Int. Cl.⁶ ......................................................... H01P 5/00
[52] U.S. Cl. ........................ 333/246; 257/692; 333/260; 361/772
[58] Field of Search ........................... 333/33, 34, 246, 333/247, 260; 257/664, 775, 692; 361/772, 773, 776

[56] References Cited

U.S. PATENT DOCUMENTS

| | | |
|---|---|---|
| 4,600,907 | 7/1986 | Grellman et al. ............... 333/260 X |
| 4,967,261 | 10/1990 | Niki et al. ........................ 257/692 X |
| 5,086,335 | 2/1992 | Leibovitz et al. .................... 287/692 |
| 5,359,227 | 10/1994 | Liang et al. .......................... 257/692 |
| 5,438,305 | 8/1995 | Hikita et al. ..................... 333/247 X |
| 5,491,302 | 2/1996 | Distefano et al. ............... 361/772 X |
| 5,508,563 | 4/1996 | Tazawa et al. ................... 257/692 X |
| 5,736,784 | 4/1998 | Dove .................................... 257/692 |
| 5,821,457 | 10/1998 | Mosley et al. .................. 361/772 X |

FOREIGN PATENT DOCUMENTS

| | | |
|---|---|---|
| 0 733 913 A2 | 9/1996 | European Pat. Off. . |
| 63-131970 | 5/1988 | Japan . |
| 1-315167 | 12/1989 | Japan ................................... 257/692 |
| 8-320375 | 3/1996 | Japan . |

Primary Examiner—Paul Gensler
Attorney, Agent, or Firm—Lyon & Lyon LLP

[57] ABSTRACT

A ribbon and a bonding wire are connected respectively to a high-frequency input and output of a microwave circuit, the width of the ribbon and/or the thickness of the bonding wire being varied continuously or discontinuously at a portion other than a portion used for bonding. By applying the ribbon and bonding wire to a microwave circuit package including a metallic substrate and sealing therein an MMIC mounted to the metallic substrate, desired high-frequency characteristics of the MMIC can be obtained.

9 Claims, 6 Drawing Sheets

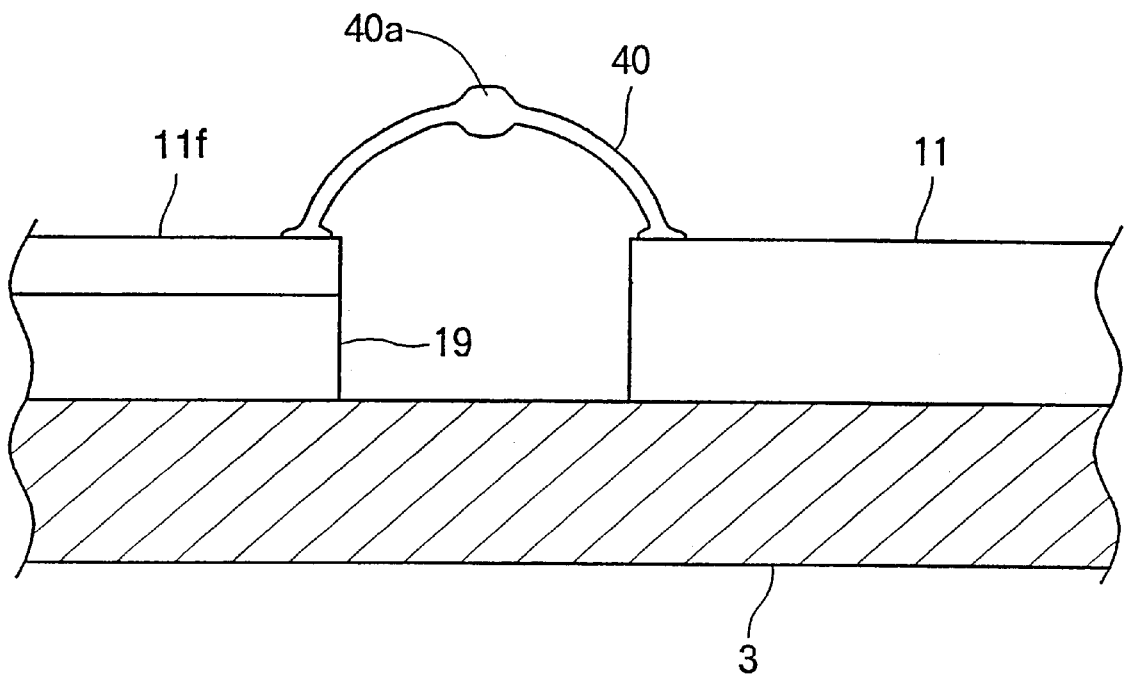
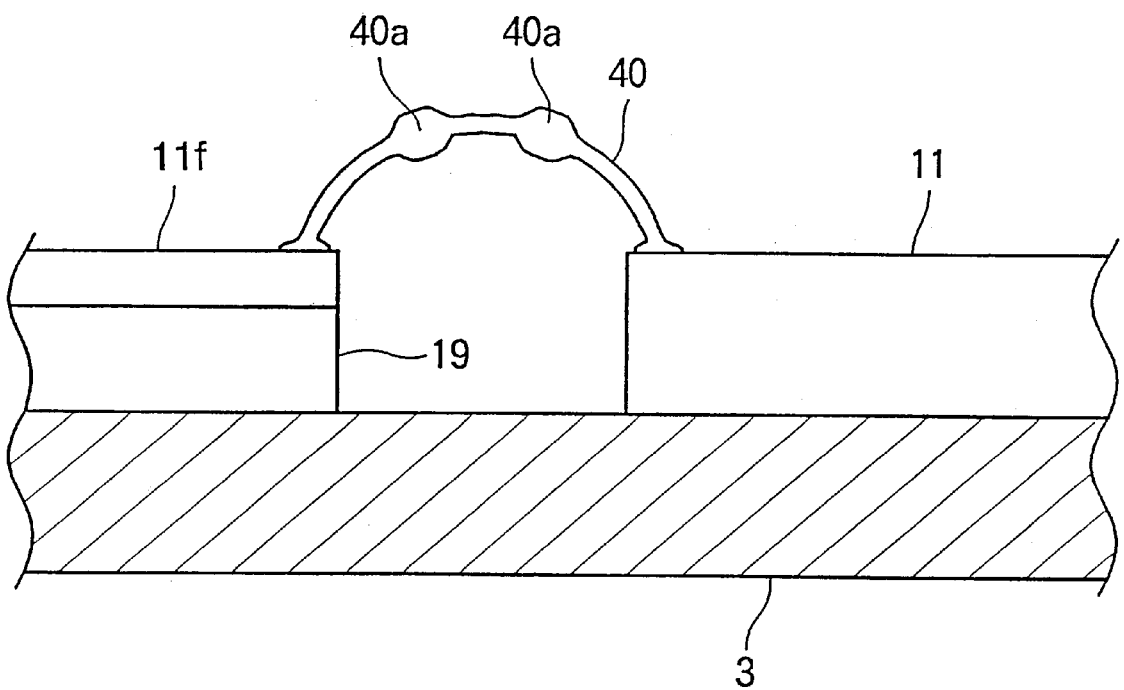

RIBBON, BONDING WIRE AND MICROWAVE CIRCUIT PACKAGE

BACKGROUND OF THE INVENTION

1. Field of the Invention

The present invention relates to an improvement in a microwave circuit package for sealing therein microwave circuitry having monolithic microwave integrated circuits (hereinafter referred to as MMICs), as well as to ribbons and bonding wires for use in fabricating the microwave circuit package.

2. Description of the Related Art

Conventionally, bonding wires having uniform diameters along their lengths, ribbons of uniform thickness and/or mesh ribbons, have been used for mounting high-frequency devices to a metallic substrate in a microwave circuit package.

Japanese Patent Laid-Open Publication No. HEI 1-300546 discloses a microwave circuit package in which electrostatic capacity is provided externally of an area of an MMIC chip by forming a dielectric layer between a metallic substrate and a biasing direct current (DC) terminal.

In such a microwave circuit package, discontinuity of impedance is likely to arise at places where ribbons and bonding wires are provided. As a result, it is likely that components such as MMICs vary in their bare characteristics after mounting or assemblage thereof, leading to deteriorated characteristics of the components.

Certain occasions arise wherein it is desired that a microwave circuit package be fabricated using metallic substrates, MMICs and bonding wires which are altered in their materials, while rendering the microwave circuit package to be compatible with a separate microwave circuit package fabricated using the same components but not involving such changes in material, by varying the post-mounting high-frequency characteristics of the MMIC and so forth.

The post-mounting high-frequency characteristics of the MMICs may be varied by changing the lengths of the ribbons and bonding wires. However, connection through the bonding wires requires of the latter to be gently curved in a proper manner. In addition, length alteration of the bonding wires is limited due to the limited space within the microwave circuit package. Another possible approach would be to change the spacing between the components such as the MMICs to allow alteration of the lengths of the ribbons. However, the space alteration is also limited and hence is not an effective solution.

SUMMARY OF THE INVENTION

It is an object of the present invention to provide a ribbon and a bonding wire which can be connected to an input and an output of a microwave circuit and allow intentional variation of the frequency characteristics of the microwave circuit.

Another object of the present invention is to provide a microwave circuit package having a metallic substrate and sealing therein an MMIC mounted to the metallic substrate, the microwave circuit package further comprising a circuit or circuit element having a ribbon and/or a bonding wire assembled thereinto for allowing intentional variation of the frequency characteristics of the resulting microwave circuit.

According to the present invention, there are provided a ribbon and a bonding wire, the width and thickness of which are varied at at least a portion other than a portion thereof used for bonding. Specifically, the ribbon width and bonding wire thickness may be varied continuously or discontinuously. The ribbon and bonding wire involving such variation may be used for the connection of a high-frequency input/output of a microwave circuit sealed in a microwave circuit package.

Effects resulting from the variation of the ribbon width and bonding wire thickness at portions other than portions thereof used for bonding may be explained as below:

The ribbon and bonding wire have such components as resistance R and reactance X, as well as the total opposition, namely, impedance Z which is a combination of the former two. Using resistance R and reactance X, the correlations may be represented by $Z=(R2+X2)^{1/2}$. Magnitude of reactance X may be represented by $X=\omega L$ with respect to inductance L and by $X=1/\omega C$ with respect to capacitance C.

Reactance X is a function of frequency f (or angular frequency $\omega=2\pi f$). In a circuit of high frequency (1–100 GHz) such as a microwave circuit, it is possible to vary reactance X significantly and hence impedance Z by slightly varying inductance L through variation of the ribbon width and bonding wire thickness.

Accordingly, by varying the width of the ribbon and the thickness of the bonding wire at portions other than portions thereof used for bonding, it becomes possible to intentionally vary the discontinuity of impedance within a microwave circuit and to thus vary the frequency characteristics of the microwave circuit.

Consequently, it also becomes possible to vary impedance in the respective microscopic portions of the ribbon and bonding wire gradually (or continuously) by continuously varying the ribbon width and bonding wire thickness.

By varying the ribbon width and bonding wire thickness discontinuously, it becomes possible to vary impedance in the respective microscopic portions of the ribbon and bonding wire suddenly (or in a phased fashion).

In a preferred form, the MMIC sealed within the microwave circuit package according to the present invention is provided with a high-frequency compensating circuit positioned closely to the bonding portions of the ribbon and bonding wire. Apart from varying the frequency characteristics of the microwave circuit through the variation of the ribbon width and bonding wire thickness, provision of such a high-frequency compensating circuit also makes it possible to independently vary the frequency characteristics of the microwave circuit in that impedance can be regulated using the high-frequency compensating circuit. The high-frequency compensating circuit may be comprised of an impedance regulating stub. As a result, it becomes possible to delicately vary the frequency characteristics of the microwave circuit using the ribbon, bonding wire and the high-frequency compensating circuit having different characteristics.

Alternatively, the high-frequency input/output of the microwave circuit within the microwave circuit package may be connected by means of the ribbon varied in thickness at at least a portion other than a portion thereof used for bonding. By varying the thickness of the ribbon at a portion other than a portion thereof used for bonding, it becomes possible to intentionally vary the discontinuity of impedance within the microwave circuit so as to effect the intentional variation of the frequency characteristics of the microwave circuit.

The high-frequency input/output of the microwave circuit within the microwave circuit package according to the present invention may desirably be connected by means of the ribbon varied in width at a portion other than a portion thereof used for bonding and having opposed ends narrower than the widths of the microwave circuit high-frequency input/output ends to which the ribbon is to be bonded. By varying the width of the ribbon at a portion other than a portion thereof used for bonding, it becomes possible to intentionally vary the discontinuity of impedance in the microwave circuit to thereby intentionally vary the frequency characteristics of the microwave circuit. By making the widths of the opposed ribbon ends narrower than the widths of the high-frequency input/output ends to which the ribbon is to be bonded, positioning of the ribbon upon bonding thereof becomes easy, leading to reduced production costs of the microwave circuit package.

The microwave circuit package according to the present invention includes a support member disposed on the metallic substrate for supporting the ribbon thereon. By disposing the support member on the metallic substrate for supporting the ribbon, increased mechanical strength may be imparted to the ribbon, thus resulting in increased reliability of the microwave circuit. When there is a height difference between the MMICs and other components, a sloped surface corresponding to the height difference may be provided on the support member so that the ribbon can be positioned to lie along the sloped surface, thus compensating for the height difference. Further, by varying the material of the support member, it becomes possible to vary capacitance between the ribbon and metallic substrate. This also enables the variation of the frequency characteristics of the microwave circuit.

The ribbon may have a width enlarged at an edge of the MMIC to the width of the strip conductor while the opposed ends thereof are arranged such that the one proximate to the MMIC has a width substantially equal to the width of the high-frequency input of the MMIC and the other proximate to the dielectric substrate has a width substantially equal to the width of the strip conductor. By varying the width of the ribbon at a portion other than a portion thereof used for bonding, it becomes possible to intentionally vary the discontinuity of impedance within the microwave circuit and hence the frequency characteristics of the microwave circuit. Particularly, by increasing the width of the ribbon at an edge of the MMIC to the width of the strip conductor, it becomes possible to obtain an arrangement similar to the arrangement in which the strip conductor extends to the high-frequency input/output ends of the MMIC. The thus obtained arrangement produces improved post-mounting frequency characteristics compared to at least the arrangement wherein the ribbon of uniform width equal to the widths of the high frequency input/output ends of the MMIC is used for connection.

Preferably, the microwave circuit package according to the present invention includes a high-frequency compensating circuit disposed on the dielectric substrate proximately to the bonding portion of the ribbon. Apart from varying the frequency characteristics of the microwave circuit through the use of the ribbon, provision of such a high-frequency compensating circuit also enables independent variation of the frequency characteristics of the microwave circuit in that impedance can be regulated through the use of the high-frequency compensating circuit. As a result, it become possible to delicately vary the frequency characteristics of the microwave circuit through the use of the ribbon and the high-frequency compensating circuit having different characteristics.

BRIEF DESCRIPTION OF THE DRAWINGS

Additional objects, advantages and features of the present invention will become apparent from the following description and appended claims, when taken in conjunction with the accompanying drawings, in which:

FIG. 6 is a view illustrating schematically a bonding wire having a flattened portion;

FIG. 7 is a view illustrating schematically a bonding wire having two flattened portions;

DETAILED DESCRIPTION OF THE PREFERRED EMBODIMENTS

Figure 1:
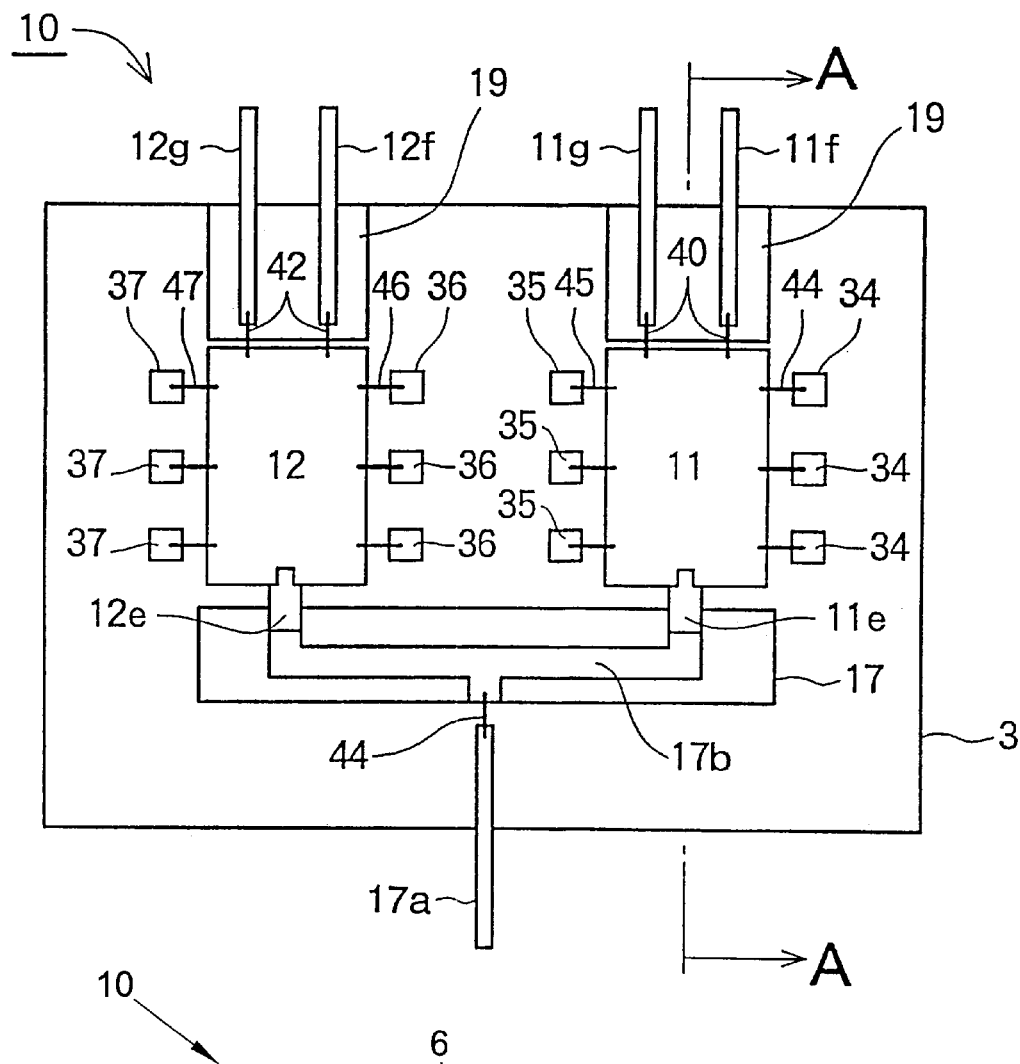
FIG. 1 is a schematic plan view illustrating a microwave circuit package according to the present invention.
Figure 2:
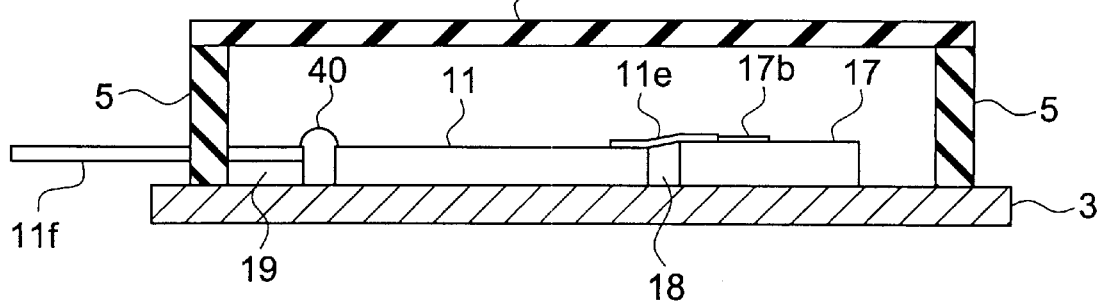
FIG. 2 is a schematic cross-sectional view taken along line A—A of FIG. 1, showing the microwave circuit package with DC terminals and bonding wires removed.

Referring to FIGS. 1 and 2, a microwave circuit package 10 according to the present invention includes a metallic substrate 3 and seals monolithic microwave integrated circuits (MMICs) 11, 12 disposed on the metallic substrate 3.

The metallic substrate 3 also seals a dielectric substrate 17 and dielectric elements 19, 19 mounted to the metallic substrate 3. The dielectric substrate 17 is provided on a surface thereof with a strip conductor 17b. The metallic substrate 3, dielectric substrate 17 and strip conductor 17b jointly provide microstrip lines.

The metallic substrate 3 is formed from Kovar or the like and also serves as a heat sink. An upper cover 6 and sides 5 are formed from a dielectric material. The MMICs 11, 12 are formed from GaAs while the dielectric substrate 17 is formed from ceramics such as alumina ceramics.

The MMIC 11 has a plurality of biasing DC terminals 34, 35 which are connected thereto by means of their respective bonding wires 44, 45 and extend through the metallic substrate 3 in an electrically insulated manner for supplying a given biasing voltage to the MMIC 11.

Similarly, the MMIC 12 has a plurality of biasing DC terminals 36, 37 which are connected thereto by means of their respective bonding wires 46, 47 and extend through the metallic substrate 3 in an electrically insulated manner for supplying a given biasing voltage to the MMIC 12.

High-frequency input of the MMIC 11 is connected to the strip conductor 17b on the dielectric substrate 17 by means of a ribbon 11e. High-frequency outputs of the MMIC 11 are connected to their respective RF terminals 11f, 11g via bonding wires 40, 40.

High-frequency input of the MMIC 12 is connected to the strip conductor 17b on the dielectric substrate 17 via a ribbon 12e. Two high-frequency outputs of the MMIC 12 are connected to their respective RF terminals 12f, 12g by means of bonding wires 42, 42.

The strip conductor 17b and RF terminal 17a on the dielectric substrate 17 are interconnected through a bonding wire 44.

Using the above-described microstrip lines, various circuits and/or circuit elements may be fabricated. For example, a distributor for distributing high-frequency signals can be formed using such microstrip lines to thereby reduce the RF terminals in number.

With the DC terminals 34–37 being arranged to extend vertically relative to the surface of the metallic substrate 3 and RF terminals 11f, 11g, 12f, 12g, 17a being disposed at opposite edges of the metallic substrate 3 and extending horizontally within a plane of the surface of the base plate 3, the microwave circuit package 10 can be placed in close proximity to a companion microwave circuit package, whereby highly dense microwave circuit package assemblage is enabled.

Figure 3A:
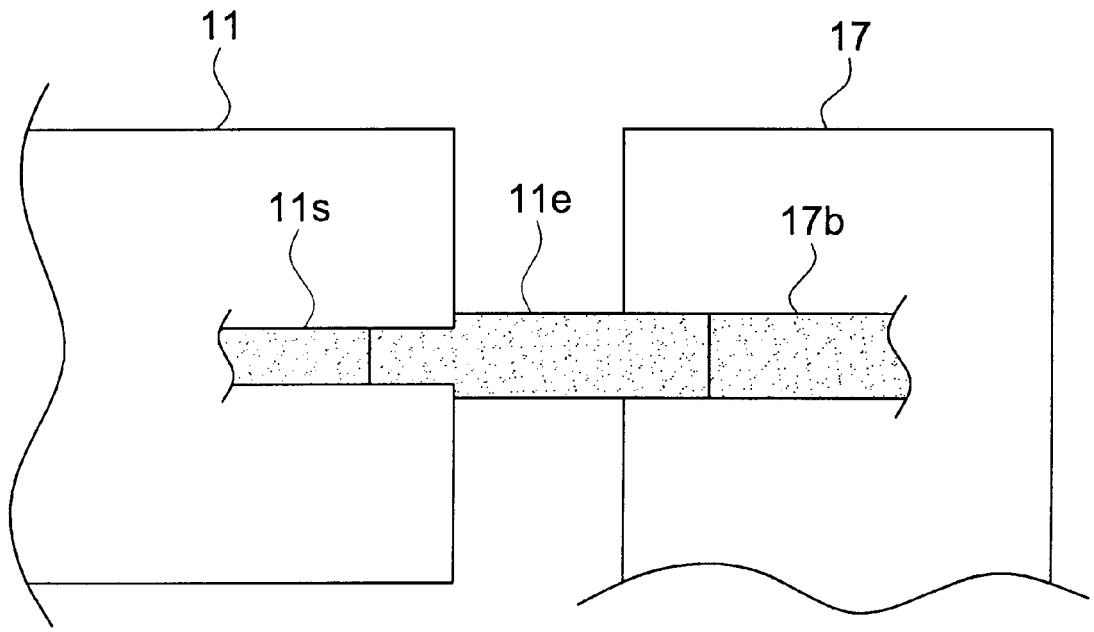
FIG. 3A is an enlarged plan view illustrating an MMIC with its high-frequency input connected to a strip conductor on a dielectric substrate by means of a ribbon.
Figure 3B:
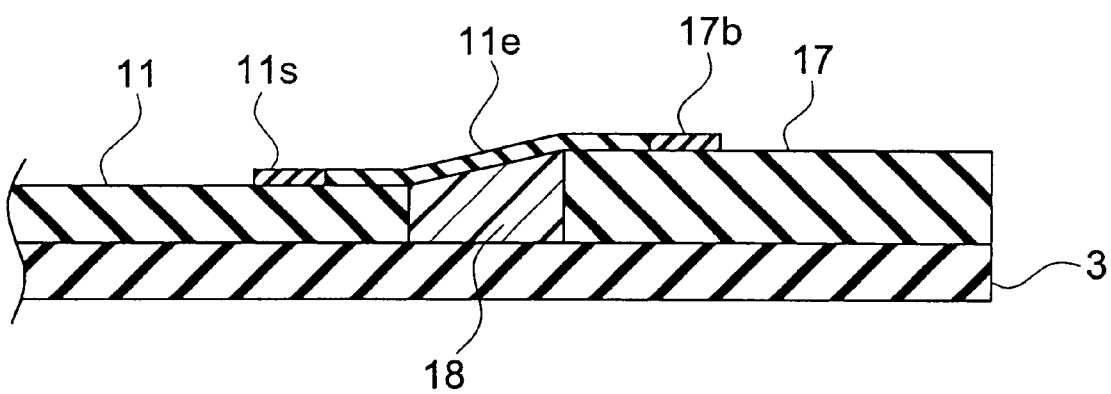
FIG. 3B is a schematic cross-sectional view of FIG. 3A.

FIG. 3A illustrates in top plan a ribbon 11e connecting the high-frequency input terminal 11s of the MMIC 11, forming part of the lines, with the strip conductor 17b on the dielectric substrate 17, and its peripheries. FIG. 3B is a cross-sectional view illustrating the ribbon 11e and its peripheries. The ribbon 11e is supported on a support member 18 which is formed of a material such as resins and disposed on the metallic substrate 3.

Ends of the ribbon 11e are bonded respectively to the high-frequency input 11s and strip conductor 17b by thermal pressure bonding or ultrasonic pressure bonding. The width of the ribbon end on the MMIC 11 side is equal to the width of the high-frequency input 11s while the ribbon end on the dielectric substrate 17 side is equal to the width of the strip conductor 17b. The width of the ribbon 11e is increased at the edge of the MMIC 11 to correspond to the width of the strip conductor 17b. Stated otherwise, the ribbon 11e has altered or varied widths at portions other than the portions to be subjected to bonding. Alternatively, the ribbon width on the MMIC 11 side may be smaller than the width of the high-frequency input 11s whilst the ribbon end on the dielectric substrate 17 side may be smaller than the width of the strip conductor 17b. That is, the end widths of the ribbon 11e may be smaller than the widths of the high-frequency input and output ends to which the ribbon 11e is to be bonded.

Figure 4A:
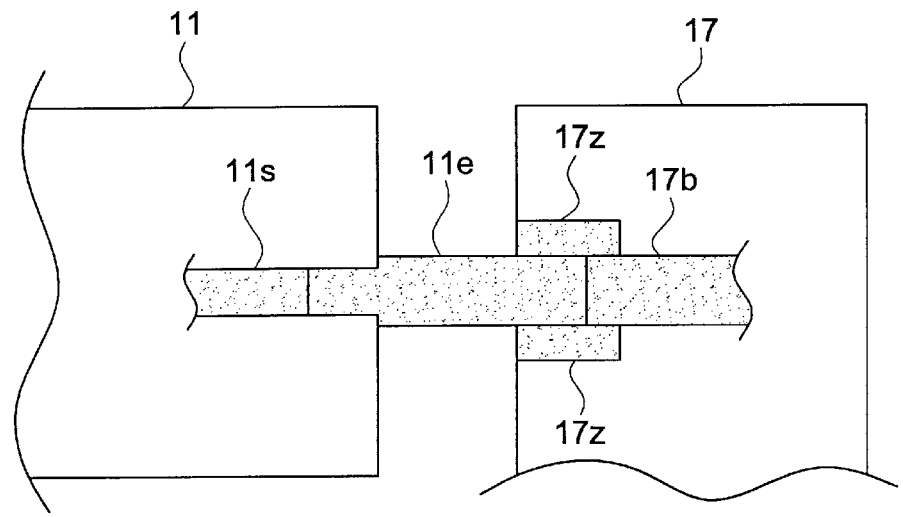
FIG. 4A is an enlarged plan view similar to FIG. 3A illustrating a high-frequency compensating circuit disposed on the dielectric substrate.
Figure 4B:
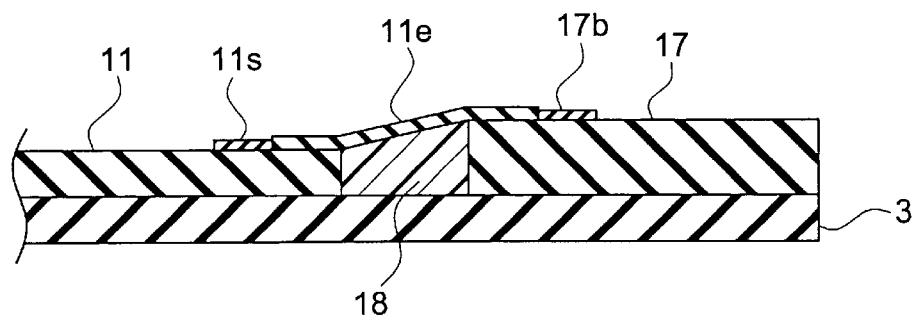
FIG. 4B is a schematic cross-sectional view of FIG. 4A.
Figure 4C:
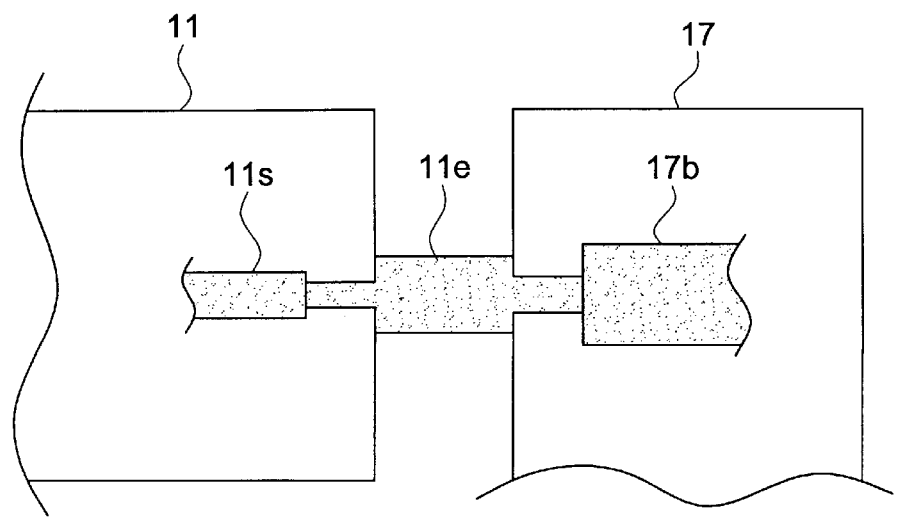
FIG. 4c shows an alternative form of compensating circuit.

FIG. 4A and FIG. 4B illustrate an embodiment of the microwave circuit package shown in FIG. 3A and FIG. 3B, in which the dielectric substrate 17 is provided with an impedance regulating stub 17z serving as a high-frequency compensating circuit. On the dielectric substrate 17 of a microstrip line for effecting high-frequency inputting and outputting, there is provided a high-frequency compensating circuit in close proximity to the bond position of the ribbon 11e. FIG. 4c shows an alternative form of compensating circuit wherein the ribbon has opposed ends of a width narrower than the central portion 11e. The high-frequency compensating circuit may comprise a bonding pad and be disposed on the MMIC 11.

Figure 5A:
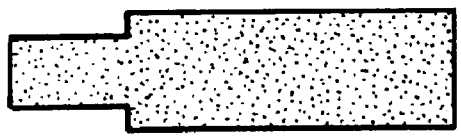
FIG. 5A–FIG. 5D schematically illustrate various ribbon configurations.
Figure 5B:
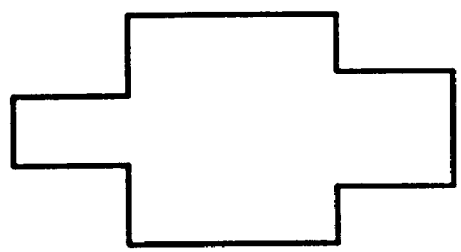
Figure 5C:
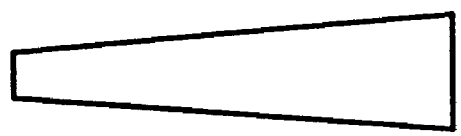
Figure 5D:
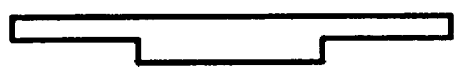

FIG. 5A–FIG. 5C illustrate various configurations of the microwave circuit ribbon according to the present invention, as seen in top plan, while FIG. 5D shows the ribbon in side elevation.

Shown in FIG. 5A is a ribbon corresponding to the ribbons 11e, 12e described in relation to FIG. 1 through FIG. 4 and having a width varied discontinuously.

The ribbon shown in FIG. 5B has ends equal in width to the ends of the ribbon shown in FIG. 5A, and a central part wider than that of the latter ribbon so that the width of the former ribbon is longitudinally varied discontinuously.

The ribbon shown in FIG. 5C is continuously varied in width longitudinally but has ends equal in width to the ends of the ribbon shown in FIG. 5A, thus providing a trapezoidal configuration.

The thickness of the ribbons shown in FIG. 5A–FIG. 5C may be varied so that a stepped portion is provided as shown in FIG. 5D. By varying the thickness of the ribbons at portions other than bonding portions thereof to provide such a stepped portion, longitudinal positioning of the ribbons upon bonding thereof becomes easy. Alternatively, the ribbons may have thicknesses uniform lengthwise.

FIG. 6 illustrates a bonding wire 40 as an example for connecting the high-frequency output and RF terminal 11f of the MMIC 11.

As shown in FIG. 6, the bonding wire 40 has a thickness or diameter altered at portions other than the bonding portions thereof. The bonding wire has a flattened portion 40a formed, for example, by pinching with a small-sized pair of tweezers. The flattened portion 40a has a substantially oval cross-section. The bonding wire 40 may be altered in configuration such that it has two flattened portions 40a, 40a at portions other than the bonding portions thereof, as shown in FIG. 7.

Figure 8:
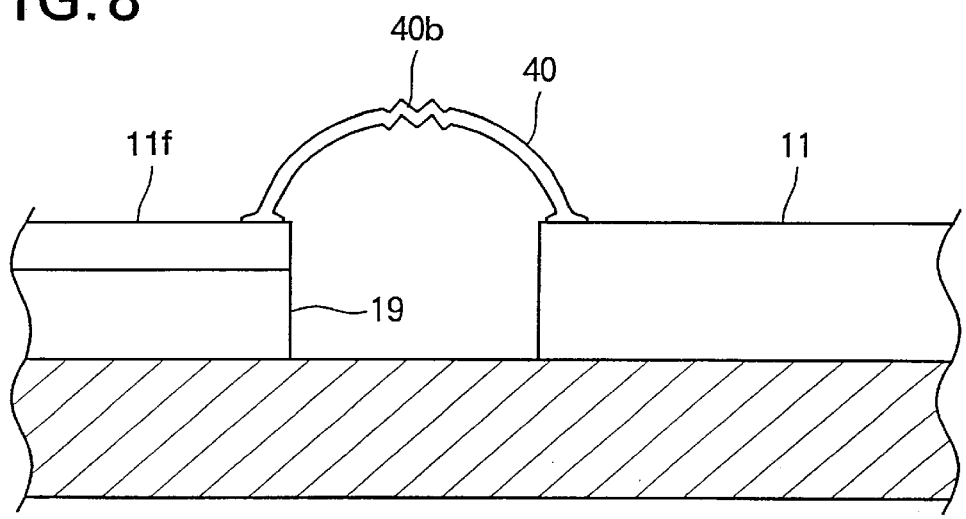
FIG. 8 is a view schematically illustrating a bonding wire with a corrugated portion.

FIG. 8 illustrates an altered form of the bonding wire 40 in which part of the bonding wire 40 is corrugated as at 40b. Such a corrugated portion can be formed, for example, by pinching a desired part of the wire with saw-teethed portions at tip ends of a small-sized pair of tweezers.

Figure 10:
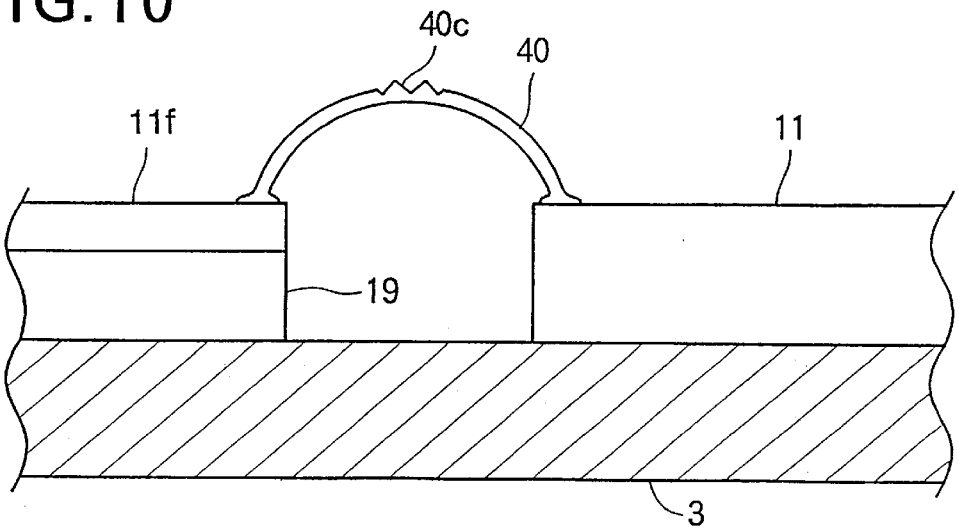
FIG. 10 is a view schematically illustrating a bonding sire with a corrugated portion on one surface thereof.

In a further altered form, the bonding wire 40 has a thickness varied discontinuously lengthwise such that it has a corrugated portion 40c on one side and a flat or straight portion on the other, the corrugated and straight portions being obtained by causing a desired part of the bonding wire to be pinched between a saw-teethed portion on one side of a tip end and a straight portion on an opposed side of a companion tip end of a pair of tweezers (see FIG. 10).

Figure 9:
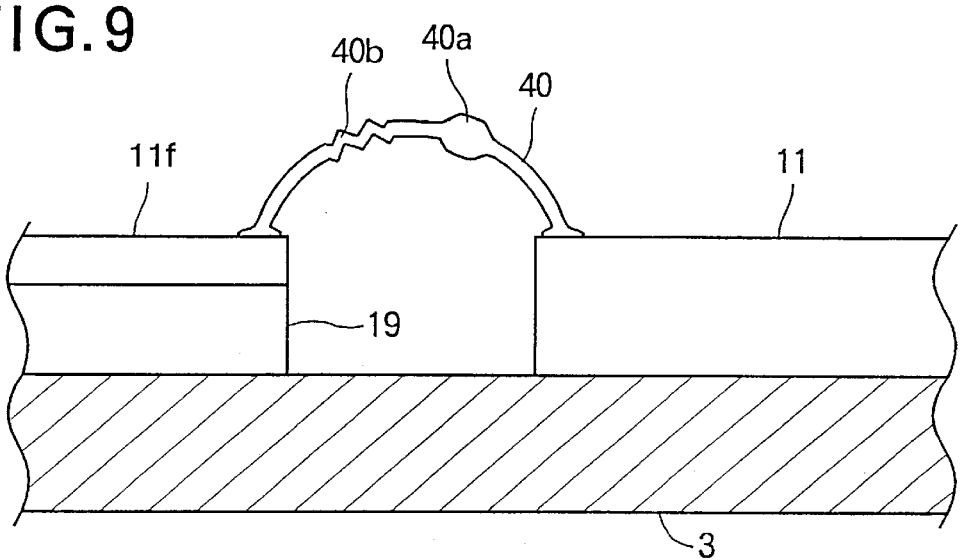
FIG. 9 is a view schematically illustrating a bonding wire having a flattened portion and a corrugated portion.

FIG. 9 illustrates a still further alteration of the bonding wire 40 in which both a flattened portion 40a and a corrugated portion 40b respectively shown in FIG. 6 and FIG. 8 are provided.

The RF terminals 11f, 11g, 12f, 12g and high-frequency output ends of the MMICs 11, 12 according to the present invention may be interconnected by means of beam leads of gold or like material, or the ribbons as used at the high-frequency input ends. Similarly, the high-frequency output ends and strip conductor 17b of the MMICs 11, 12 may be interconnected through the above-described inventive bonding wires. The RF terminals 11f, 11g, 12f, 12g, 17a may be arranged to extend vertically with respect to the surface of the metallic substrate 3 like the DC terminals 34–37.

The present invention may also be applied to the radar module and antenna apparatus as proposed in Japanese Patent Application No. HEI 7-239311. For example, a plurality of MMICs, each including four high-frequency field effect transistors (FETs) and two mixers, may be mounted to the package so as to provide a multichip circuit.

As thus far explained, the ribbons, bonding wires and/or microwave circuit package employing the same according to the present invention allow intentional alteration or variation of discontinuity of impedance within the microwave circuit in that the width of the ribbons and/or the thickness of the bonding wires are altered at portions other than the bonding portions thereof, whereby the frequency characteristics of the microwave circuit can be varied intentionally by virtue of the ribbons and bonding wires incorporating such intentional alterations.

Also, impedance in the respective microscopic portions of the ribbons and bonding wires and hence the microwave circuit package according to the present invention can be varied gradually (or continuously).

Further, impedance in the respective microscopic portions of the ribbons and/or the bonding wires and hence the microwave circuit package according to the present invention can be effectively varied suddenly (or in a phased manner) since the width of the ribbons and/or the thickness of the bonding wires are varied discontinuously.

Additionally, in the microwave circuit package according to the present invention, the frequency characteristics of the microwave circuits can be varied not only by the ribbons and/or the bonding wires but also by the high-frequency compensating circuit provided for impedance regulation. As a result, it becomes possible to make slight changes in the frequency characteristics of the microwave circuits by means of the high-frequency compensating circuit and the ribbons and/or bonding wires having different characteristics.

Since the microwave circuit package according to the present invention employs the inventive ribbons varied in thickness at portions other than the bonding portions thereof, it becomes possible to intentionally vary the discontinuity of impedance in the microwave circuit, thus enabling intentional variation of the frequency characteristics of the microwave circuit.

Also, since the microwave circuit package according to the present invention employs the ribbons varied in width at portions other than the bonding portions thereof, it becomes possible to intentionally vary the discontinuity of impedance in the microwave circuit, thus enabling intentional variation of the frequency characteristics of the microwave circuit. In particular, since the ribbons are provided with opposite ends having widths narrower than the widths of the high-frequency input/output ends of the ribbons at which the latter are to be bonded, positioning of the ribbons upon bonding thereof becomes easy, thereby reducing the production costs of the microwave circuit package.

Furthermore, in the microwave circuit package according to the present invention, the support member supporting the ribbons thereon is disposed on the metallic substrate. As a result, it becomes possible to impart mechanical strength to the ribbons, thus resulting in increased reliability of the microwave circuit. When there is a height difference between the high-frequency inputting/outputting MMICs or the like, a sloped surface corresponding to the height difference may be provided on the support member so that the ribbons can be positioned to lie along the sloped surface, thus compensating the height difference. By altering the material of the support member, it also becomes possible to vary the capacitance between the ribbons and the metallic substrate. Utilization of this further enables varying of the frequency characteristics of the microwave circuit.

In the microwave circuit package according to the present invention, by intentionally varying the width of the ribbons at portions other than the bonding portions thereof, it becomes possible to intentionally vary the discontinuity of impedance within the microwave circuit, whereby intentional variation of the frequency characteristics of the microwave circuit is enabled. Particularly, by increasing the ribbon width at the edges of the MMICs up to the width of the strip conductor, it becomes possible to obtain an arrangement similar to the one in which the strip conductor extends up to the high-frequency input/output ends of the MMICs. The thus-obtained arrangement provides increased post-mount high-frequency characteristics of the MMICs compared to at least the arrangement in which the ribbons of uniform width equal to the width of the high-frequency input/output ends of the MMICs are used for connection.

As already explained above, in the microwave circuit package according to the present invention, the frequency characteristics of the microwave circuit can be varied via the ribbons. Such frequency variation can also be achieved through impedance regulation using the high-frequency compensating circuit. Thus, subtle or delicate variation of the frequency characteristics of the microwave circuit is enabled by using the ribbons and high-frequency compensating circuit having different characteristics.

Moreover, since the high-frequency compensating circuit in the microwave circuit package according to the present invention is comprised of the impedance regulating stub disposed in close proximity to the bonding portions of the ribbons and/or the bonding wires, impedance regulation can be effected on the MMIC side, as well as on the dielectric substrate side.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A microwave circuit package including a metallic substrate and sealing therein a microwave circuit mounted to said metallic substrate, said microwave circuit package further comprising:

a ribbon having a width and connected to a high frequency input of said microwave circuit;

a bonding wire having a thickness and connected to a high-frequency output of said microwave circuit;

at least one of the width of said ribbon and the thickness of said bonding wire being varied intermediate the ends thereof at at least a portion other than a bonding portion thereof, the bonding portion being at an end thereof; and said microwave circuit for inputting/outputting a high-frequency including a high-frequency impedance regulating compensating circuit disposed proximately to the bonding portions of at least one of said ribbon and bonding wire.

2. A microwave circuit package according to claim 1, wherein the variation of the ribbon width or the bonding wire thickness is continuous.

3. A microwave circuit package according to claim 1, wherein the variation of the ribbon width or the bonding wire thickness is discontinuous.

4. A microwave circuit package according to claim 1, wherein said high-frequency compensating circuit comprises an impedance regulating stub.

5. A microwave circuit package including a metallic substrate and sealing therein a microwave circuit mounted to said metallic substrate, said microwave circuit package further comprising:

a ribbon having a thickness and connected to a high-frequency input of said microwave circuit, the thickness of said ribbon being varied intermediate the ends thereof at least a portion other than a bonding portion thereof, the bonding portion being at an end thereof; and a support member disposed on said metallic substrate for supporting said ribbon thereon.

6. A microwave circuit package including a metallic substrate and sealing therein a microwave circuit mounted to said metallic substrate, said microwave circuit package further comprising:

a ribbon having a width and connected to a high-frequency input of said microwave circuit, the width of said ribbon being varied intermediate the ends thereof at at least a portion thereof other than a bonding portion thereof, the bonding portion being at an end thereof, said ribbon having opposed ends of a width narrower than the width of the high-frequency input to which said ribbon is to be bonded; and a support member disposed on said metallic substrate for supporting said ribbon thereon.

7. A microwave circuit package including a metallic substrate and sealing therein a microwave circuit mounted to said metallic substrate, said microwave circuit package further comprising:

a dielectric substrate having a strip conductor having a width and mounted to said metallic substrate in a sealed fashion;

a ribbon having a width connected to a high frequency input of said microwave circuit;

said ribbon having opposed ends, one of said opposed ends proximate to said microwave circuit having a width substantially equal to the width of said high-frequency input of said microwave circuit and the other of said opposed ends proximate to said dielectric substrate having a width substantially equal to the width of said strip conductor;

the ribbon width at an edge of said microwave circuit being enlarged to the width of said strip conductor; and a high frequency impedance regulating compensating circuit disposed on said dielectric substrate in close proximity to the bonding portion of said ribbon, the bonding portion being at an end thereof.

8. A microwave circuit package according to claim 7, wherein said high-frequency compensating circuit comprises an impedance regulating stub.

9. An edge conductor structure for interconnecting a microwave circuit with a substrate comprising a plurality of conductors, each of the plurality of conductors comprises a first end bonded to the microwave circuit, a second end connected to the substrate and a widened central part which is widened with respect to at least one of said ends, and the central part having a stepped portion of increased thickness.

* * * * *

(12) EX PARTE REEXAMINATION CERTIFICATE (5040th)
United States Patent
Shingyoji et al.

(10) Number: US 5,936,492 C1
(45) Certificate Issued: Dec. 14, 2004

(54) RIBBON, BONDING WIRE AND MICROWAVE CIRCUIT PACKAGE

(75) Inventors: Masahito Shingyoji, Wako (JP); Nobuyoshi Takeuchi, Wako (JP)

(73) Assignee: Honda Giken Kogyo Kabushiki Kaisha, Tokyo (JP)

Reexamination Request:
No. 90/005,876, Dec. 6, 2000

Reexamination Certificate for:
Patent No.: 5,936,492
Issued: Aug. 10, 1999
Appl. No.: 08/844,921
Filed: Apr. 22, 1997

(30) Foreign Application Priority Data

Apr. 24, 1996 (JP) ............................................. 8-102814

(51) Int. Cl.$^7$ ................................................ H01P 5/00
(52) U.S. Cl. ...................... 333/246; 333/260; 257/692; 361/772
(58) Field of Search ................................. 333/238, 246, 333/260, 33, 34, 35, 247; 257/664, 692, 775; 361/772, 773, 776

(56) References Cited

U.S. PATENT DOCUMENTS 4,600,907 A * 7/1986 Grellman et al. ........... 333/246
5,113,161 A   5/1992 Inami et al.
5,294,751 A   3/1994 Kamada
5,847,453 A * 12/1998 Uematsu et al. ........ 333/247 X

FOREIGN PATENT DOCUMENTS

| JP | 55075301 | 6/1980 | ............. H01P/1/00 |
| JP | 59039055 | 3/1984 | ............. H01L/23/48 |
| JP | 02237301 | 9/1990 | ............. H01P/5/08 |
| JP | 03131102 | 6/1991 | ............. H01P/5/08 |
| JP | 02185047 | 7/1999 | ............. H01L/21/60 |

OTHER PUBLICATIONS

EPO (Search Report) for App. No. 97105797.1—1270, Jun. 11, 1999.

* cited by examiner

*Primary Examiner*—Benny T. Lee

(57) ABSTRACT

A ribbon and a bonding wire are connected respectively to a high-frequency input and output of a microwave circuit, the width of the ribbon and/or the thickness of the bonding wire being varied continuously or discontinuously at a portion other than a portion used for bonding. By applying the ribbon and bonding wire to a microwave circuit package including a metallic substrate and sealing therein an MMIC mounted to the metallic substrate, desired high-frequency characteristics of the MMIC can be obtained.

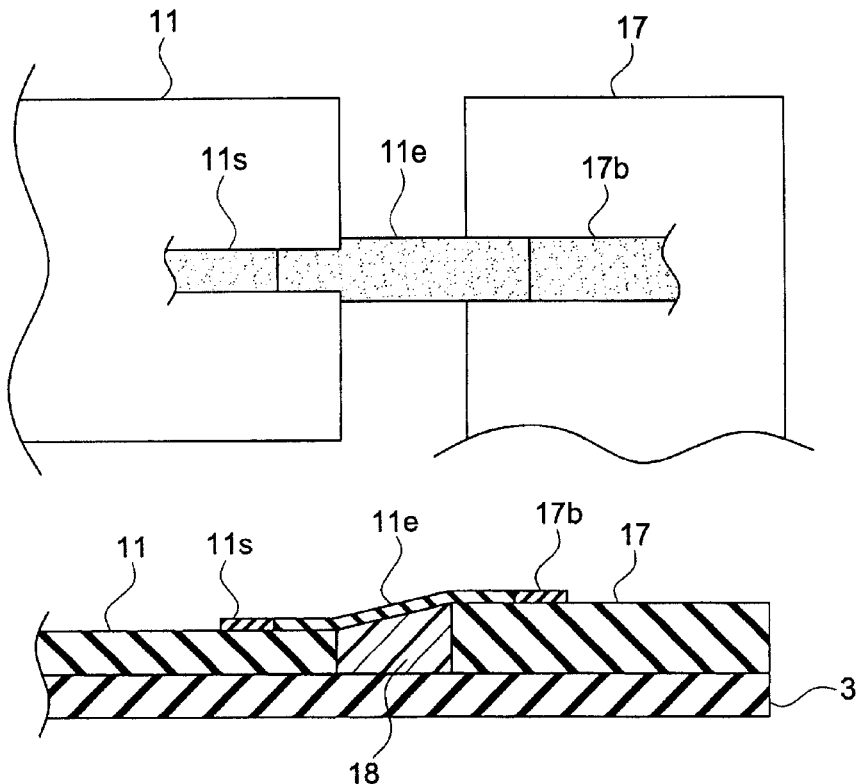

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–4 and 7–9 is confirmed.

Claims 5 and 6 are determined to be patentable as amended.

5. A microwave circuit package including a metallic substrate and sealing therein a microwave circuit mounted to said metallic substrate, said microwave circuit package further comprising:
 a ribbon having a thickness and connected to a high-frequency input of said microwave circuit, the thickness of said ribbon being varied intermediate the ends thereof at least a portion other than a bonding portion thereof, the bonding portion being at an end thereof; and
 a support member disposed on said metallic substrate for supporting said ribbon thereon, *said support member filling a space between said metallic substrate and said ribbon so as to prevent any voids therebetween.*

6. A microwave circuit package including a metallic substrate and sealing therein a microwave circuit mounted to said metallic substrate, said microwave circuit package further comprising:
 a ribbon having a width and connected to a high-frequency input of said microwave circuit, the width of said ribbon being varied intermediate the ends thereof at at least a portion thereof other than a bonding portion thereof, the bonding portion being at an end thereof,
 said ribbon having opposed ends of a width narrower than the width of the high-frequency input to which said ribbon is to be bonded; and
 a support member disposed on said metallic substrate for supporting said ribbon thereon, *said support member filling a space between said metallic substrate and said ribbon so as to prevent any voids therebetween.*

\* \* \* \* \*